(12) United States Patent
Nguyen

(10) Patent No.: US 11,031,311 B2
(45) Date of Patent: Jun. 8, 2021

(54) PACKAGED SEMICONDUCTOR DEVICE WITH MULTILAYER STRESS BUFFER

(71) Applicant: Texas Instruments Incorporated, Dallas, TX (US)

(72) Inventor: Luu Thanh Nguyen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/197,413

(22) Filed: Nov. 21, 2018

(65) Prior Publication Data

US 2020/0161205 A1  May 21, 2020

(51) Int. Cl.
| | |
|---|---|
| *H01L 21/44* | (2006.01) |
| *H01L 21/48* | (2006.01) |
| *H01L 23/29* | (2006.01) |
| *H01L 23/31* | (2006.01) |
| *H01L 21/56* | (2006.01) |
| *H01L 21/78* | (2006.01) |
| *H01L 21/02* | (2006.01) |
| *H01L 23/00* | (2006.01) |
| *H01L 23/495* | (2006.01) |

(52) U.S. Cl.
CPC .... *H01L 23/3135* (2013.01); *H01L 21/02118* (2013.01); *H01L 21/02288* (2013.01); *H01L 21/561* (2013.01); *H01L 21/565* (2013.01); *H01L 21/78* (2013.01); *H01L 23/295* (2013.01); *H01L 23/3121* (2013.01); *H01L 23/49541* (2013.01); *H01L 24/48* (2013.01); *H01L 2224/48091* (2013.01); *H01L 2224/48106* (2013.01); *H01L 2224/48247* (2013.01)

(58) Field of Classification Search
CPC ......... H01L 21/02118; H01L 21/02288; H01L 21/561; H01L 21/565; H01L 21/78; H01L 23/295; H01L 23/3121; H01L 21/56; H01L 23/3131; H01L 23/3192; H01L 23/3164; H01L 23/291; H01L 23/293; H01L 23/28; H01L 23/0488; H01L 31/0203; H01L 33/048; H01L 33/52
USPC .......................... 257/790; 438/124, 126–127
See application file for complete search history.

(56) References Cited

U.S. PATENT DOCUMENTS

| | | | | |
|---|---|---|---|---|
| 6,900,531 B2 * | 5/2005 | Foong | ............... | H01L 27/14618 257/100 |
| 7,002,257 B2 * | 2/2006 | Tao | .......................... | H01L 24/32 257/686 |

* cited by examiner

*Primary Examiner* — Caleb E Henry
*Assistant Examiner* — Dilinh P Nguyen
(74) *Attorney, Agent, or Firm* — Ronald O. Neerings; Charles A. Brill; Frank D. Cimino

(57) ABSTRACT

In a described example, a packaged semiconductor device includes: a semiconductor die with a component proximate to a surface of the semiconductor die; the semiconductor die mounted on a substrate. The component is covered with a first polymer layer with a first modulus and at least a portion of the first polymer layer is covered by at least one second polymer layer with a second modulus and the second modulus is greater than the first modulus. The semiconductor die and a portion of the substrate are covered with mold compound.

25 Claims, 17 Drawing Sheets

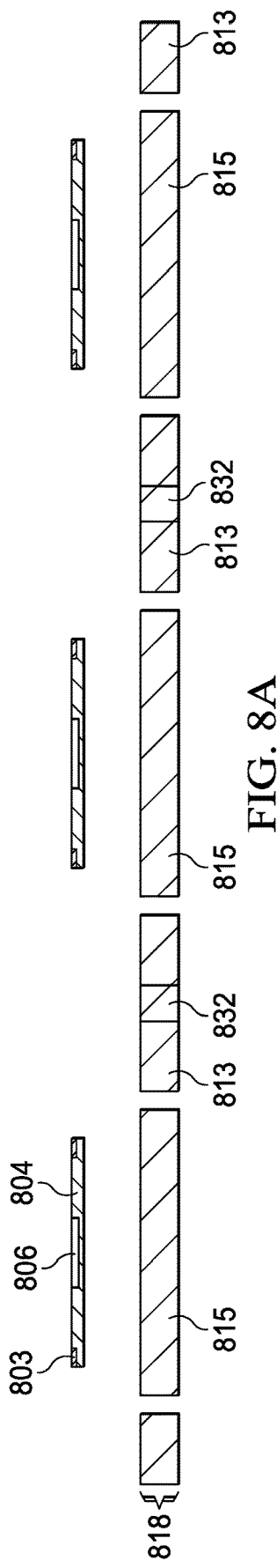
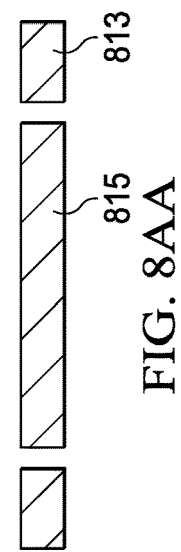
FIG. 8A
FIG. 8AA

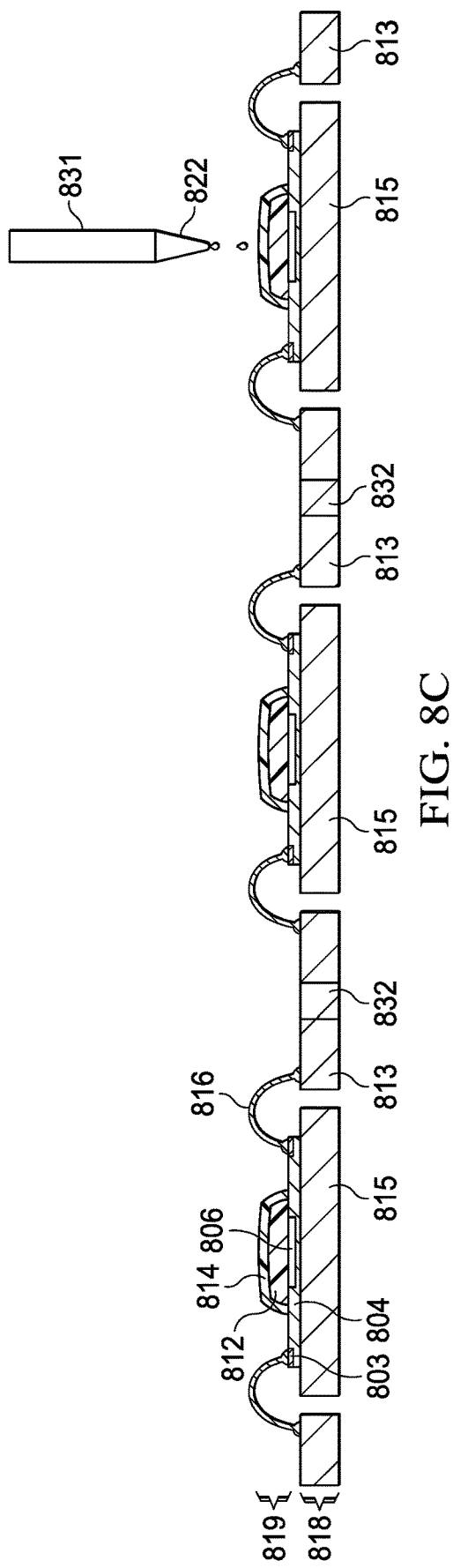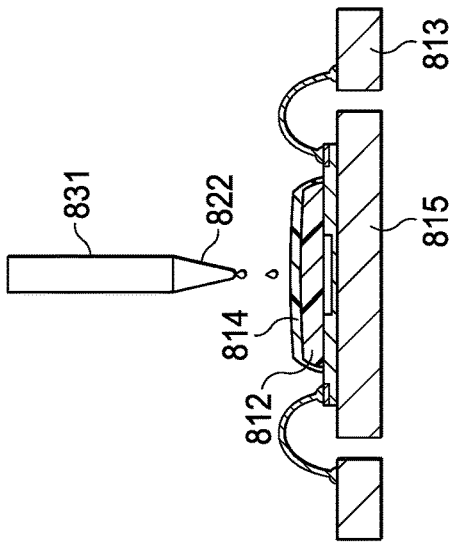

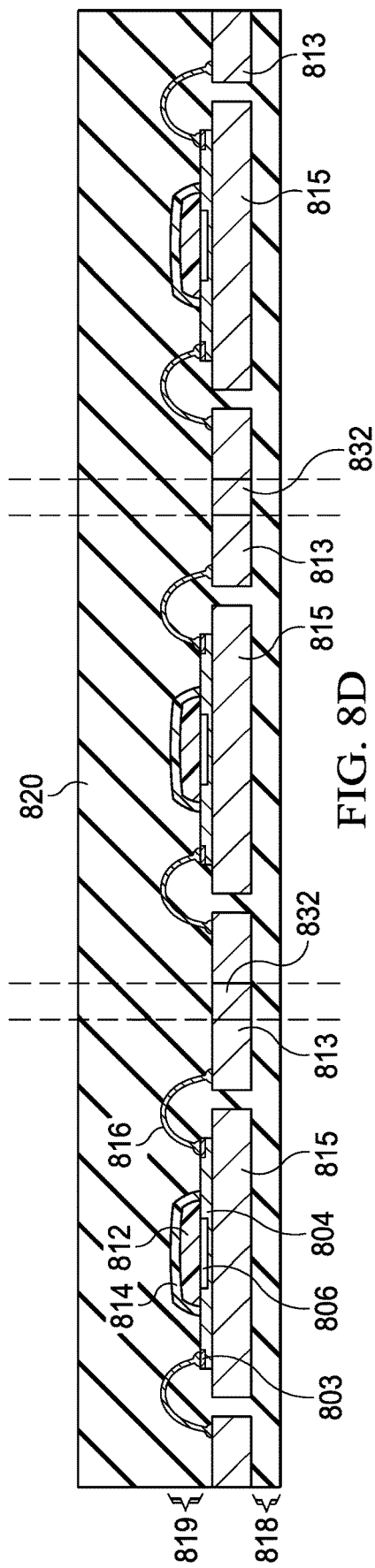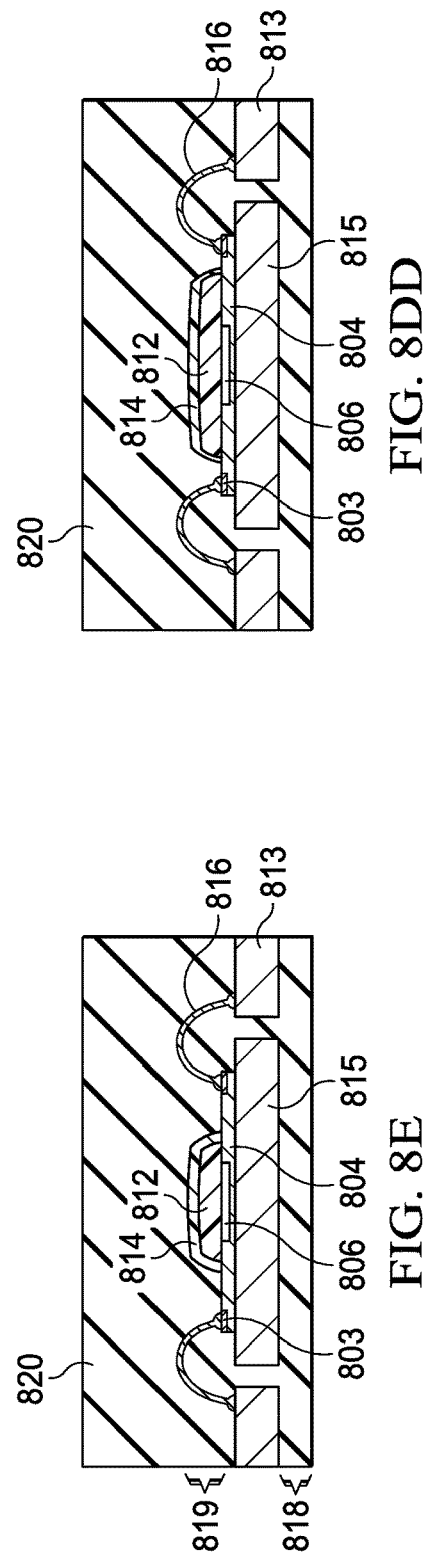

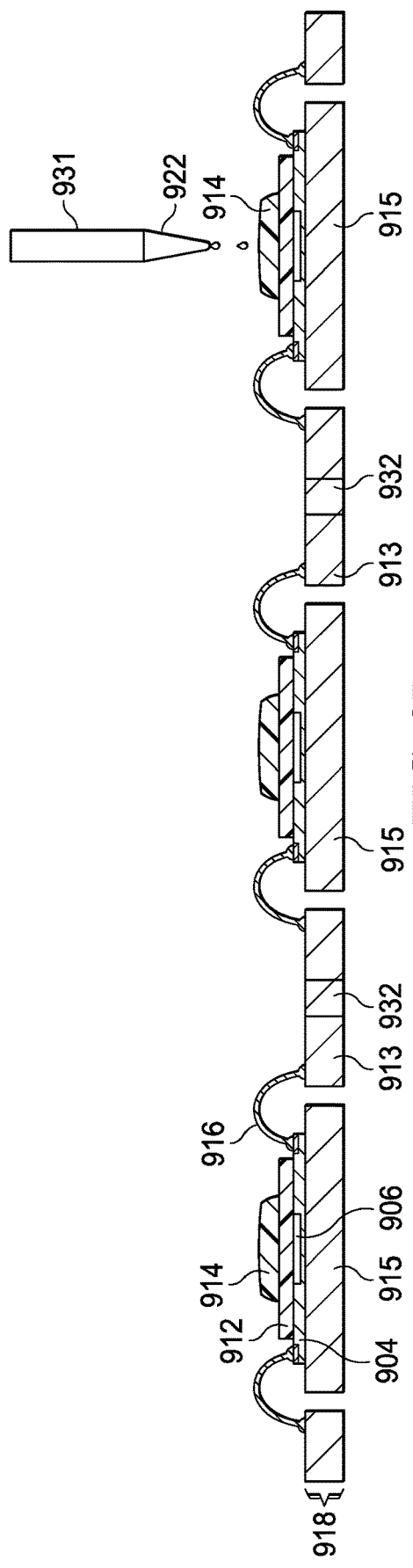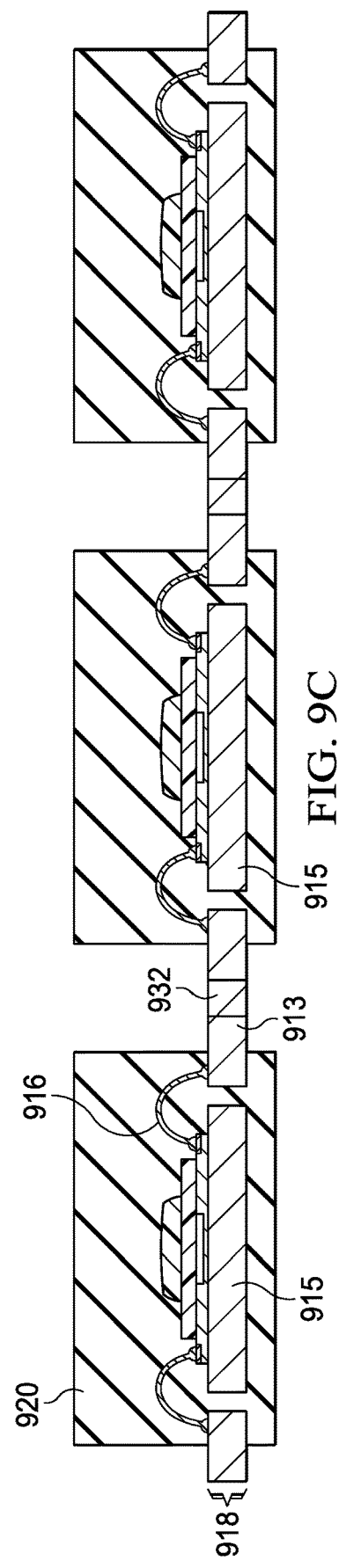

PACKAGED SEMICONDUCTOR DEVICE WITH MULTILAYER STRESS BUFFER

TECHNICAL FIELD

This disclosure relates generally to semiconductor device packaging, and more particularly to formation of a semiconductor device package with reduced stress.

BACKGROUND

Individual semiconductor device (SD) dies are packaged by bonding the dies to a substrate and then encapsulating the dies and portions of the substrate in a mold compound. The semiconductor device can be an integrated circuit (IC) or can be an individual power transistor, capacitor, or other semiconductor device.

The mold compound is a plastic resin filled with particles such as silica or aluminum oxide particles. Filler can comprise over 90% of the mold compound by weight. The mold compound is either a liquid at room temperature or a solid at room temperature. If a solid, it can be heated to a molten state. The mold compound is injected into a mold containing the substrate and die. After the mold compound cools the packaged semiconductor device (PSD) is removed from the mold. During curing and cooling the mold compound shrinks and unintentionally applies compressive and/or shear stress to the die in the PSD. Mold compounds can have curing stresses in the range of 20 to several hundred mega (million) pascals (MPa). Stress on the PSD can be amplified when concentrated by points on filler particles pressing against the semiconductor device. Larger filler particles concentrate more stress and apply more pressure against the semiconductor device. The die may contain a component with electrical properties that are changed by compressive and/or shear stress. Example components that are subject to changing properties under compressive stress include a component such as a bipolar junction transistor (BJT), an analog transistor, an analog-to-digital (A/D) converter or a bulk acoustic wave (BAW) device. Random placement of large particles can apply force to some capacitors in an A/D converter capacitor array causing capacitor mismatch that can result in a reduced number of bits in the converted A/D signal.

SUMMARY

In a described example, a packaged semiconductor device includes: a semiconductor die with a component proximate to a surface of the semiconductor die; the semiconductor die mounted on a substrate. The component is covered with a first polymer layer with a first modulus and at least a portion of the first polymer layer is covered by at least one second polymer layer with a second modulus. The second modulus is greater than the first modulus. The semiconductor die and a portion of the substrate are covered with mold compound.

BRIEF DESCRIPTION OF THE DRAWINGS

FIG. 4AA is a closeup view of the edge of the second polymer layer ink-jet deposited on the surface of the spin-coated or slit coated first polymer layer shown in FIG. 4A.

FIG. 8A is a cross section of multiple lead frames initially connected together by saw streets a lead frame strip and a die spaced above each lead frame prior to assembly.

FIG. 8AA is a cross section of one of the lead frames and dies of FIG. 8A.

FIG. 8BB is a cross section of one of the lead frames and dies of FIG. 8B.

FIG. 8C is the cross section of FIG. 8B in which a second polymer layer is formed on top and side surfaces of the first polymer layers.

FIG. 8CC is a cross section of one of the lead frames and dies of FIG. 8C.

FIG. 8D is the cross section of FIG. 8C in which the lead frames and dies are encapsulated with a mold compound.

FIG. 8DD is a cross section of one of the encapsulated dies and lead frames in FIG. 8D.

FIG. 8E is similar to the encapsulated die and lead frame shown in FIG. 8DD in which the first and second polymer layers are less wide that those in FIG. 8DD.

FIG. 9B is the cross section of FIG. 8A in which each die is attached to respective die attach mount of a respective lead frame and wire bonded to the leads of the lead frame, a first polymer layer covering a component in the die and a second polymer layer cover a portion of the first polymer layer opposite the die.

FIG. 9C is the cross section of FIG. 9B in which the lead frames and dies are encapsulated with a mold compound.

DETAILED DESCRIPTION

Figure 1A:
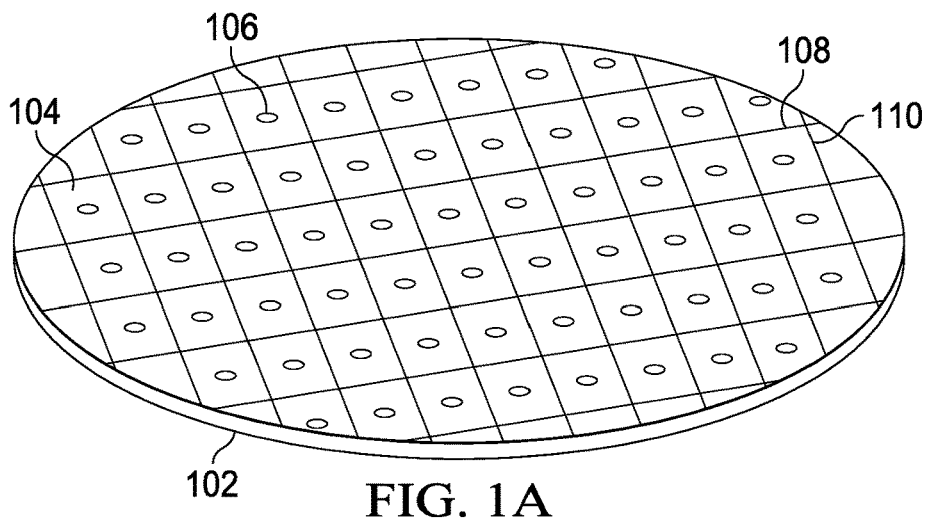
FIG. 1A is a projection views of a semiconductor wafer with device dies uncoated.

Corresponding numerals and symbols in the different figures generally refer to corresponding parts unless otherwise indicated. The figures are not necessarily drawn to scale.

In the arrangements, the problem of stress to a component within or on a semiconductor die with changing characteristics due to stress caused by mold compound is solved by forming a multiple layer stress buffer over the component prior to forming a package body using mold compound.

In certain arrangements described herein, a process for depositing material is referred to as "ink-jet deposition." In ink-jet deposition, liquid material is deposited by forming drops using nozzles fed by a reservoir of the liquid material. As the drops fall the drops become spherical shapes due to surface tension and gravity. An electrical signal causes the drop to form, and this is sometimes referred to as "drop on demand" or DOD technology. In an example ink-jet deposition tool, an electrostatic actuator forces a known volume of liquid from a nozzle in response to a signal. In an alternative approach, a small resistive heating element heats the reservoir causing a small volume of the liquid to be expelled from the nozzle. In ink-jet printing, text or visible symbols can be formed on a surface for viewing using ink-jet deposition. In the arrangements herein, materials are deposited in layers on a surface using ink-jet deposition. An ink-jet deposition tool may have tens or hundreds of small nozzles arranged in a head that is moved with respect to the surface the material is to be deposited on. The material can be deposited as a single layer in one pass or in multiple layers in multiple passes, depending on the thickness desired. Because ink-jet deposition is very precise and the material can be precisely placed, no cleaning, strip or etch processes are required to remove excess material. Because the ink-jet deposition tool can perform "drop on demand" operations, no masking or stencil is required. The ink-jet tool can traverse over a substrate in a raster scan fashion or other pattern, or alternatively, the surface where material is to be deposited can be moved relative to a fixed ink-jet deposition tool head. After deposition the layer of liquid material can be cured by thermal curing or by UV curing, depending on the material used.

In the arrangements described herein, the term "substrate" is used. As used herein, a substrate is a support having a surface suitable for mounting a semiconductor device. In the arrangements, useful substrates can include: lead frames of copper, copper alloys, stainless steel or other conductive metals (such as Alloy 42); molded interconnect substrates; pre-molded lead frames with lead frame conductors and mold compound in a preformed structure; tape based and film-based substrates carrying conductors; laminate substrates with multiple layers of conductors and insulator layers; and printed circuit board substrates of ceramic, plastic, fiberglass or resin, such as FR4.

Figure 2A:
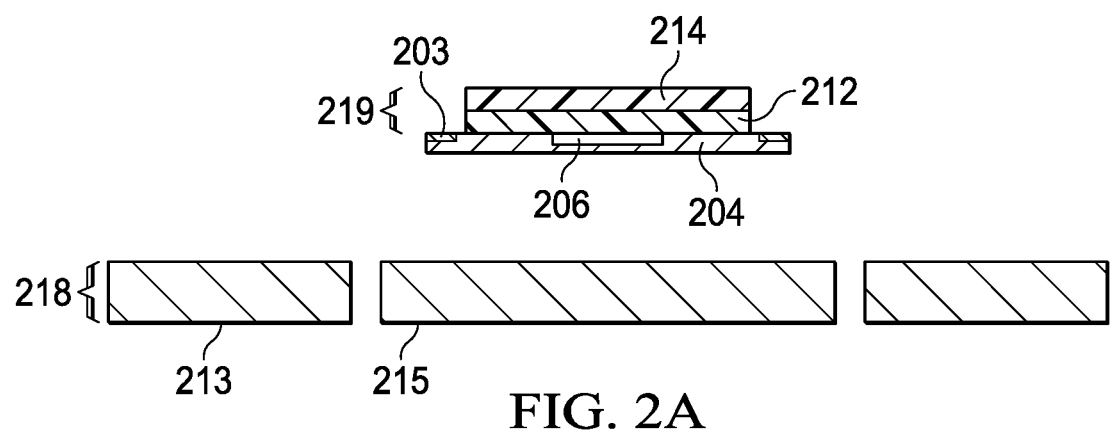
FIG. 2A is a cross sectional views of a singulated die, spaced above a die mount pad of a lead frame, the singulated die having a stress buffer spaced above a component in the die, the stress buffer having first and second polymer layers of substantially equal width.
Figure 2B:
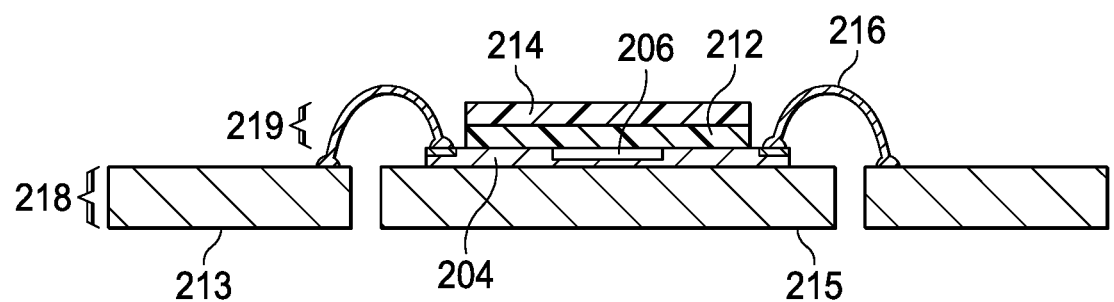
FIG. 2B is a cross sectional view of the singulated die of FIG. 2A attached to the die mount pad and wire bonded to leads of the lead frame.
Figure 2C:
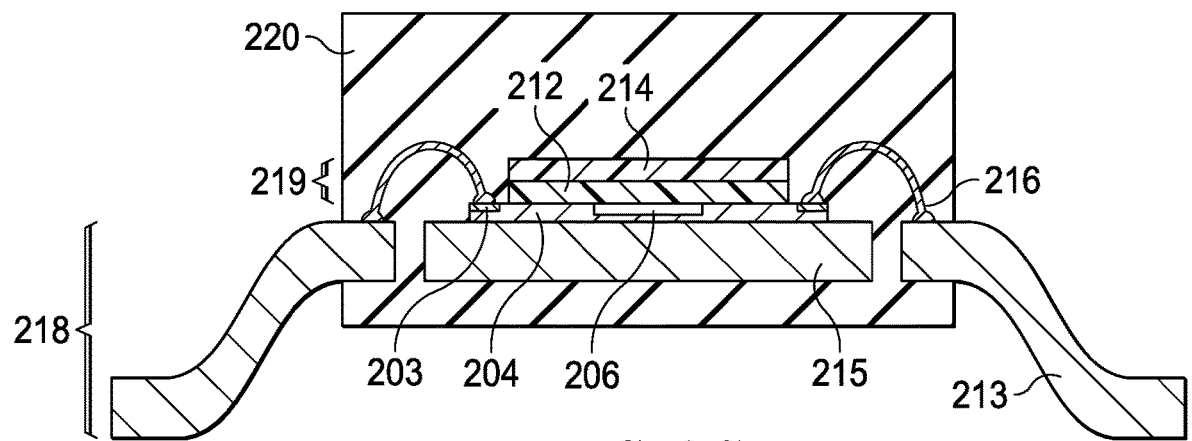
FIG. 2C is a cross section of the singulated die attached to the die mount pad of FIG. 2B further encapsulated with mold compound.
Figure 2D:
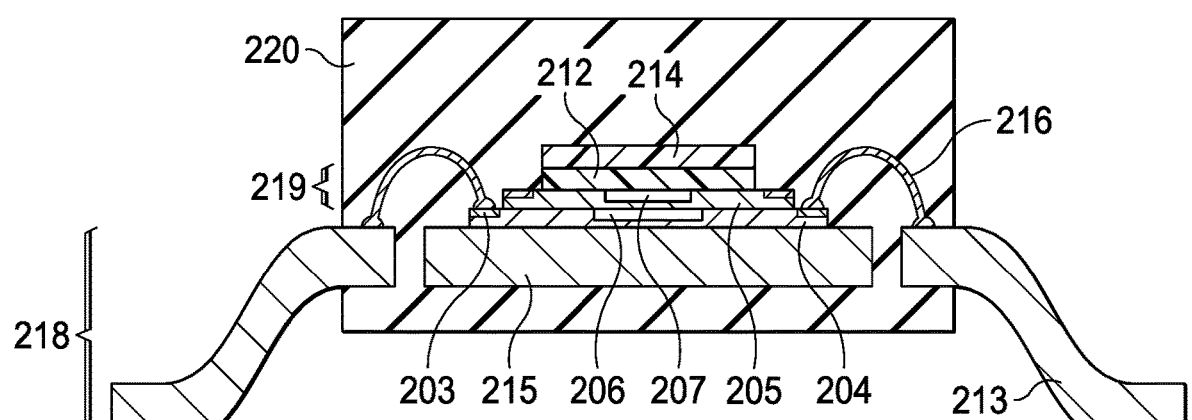
Figure 4A:
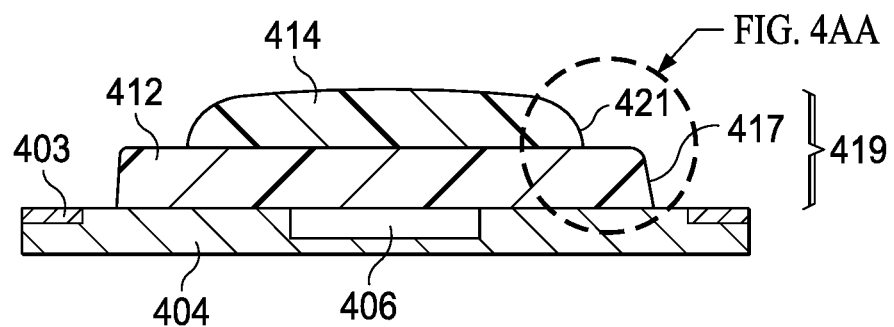
FIG. 4A is a cross section of a semiconductor die with a component covered with a first polymer layer and a second polymer layer.
Figure 4A:
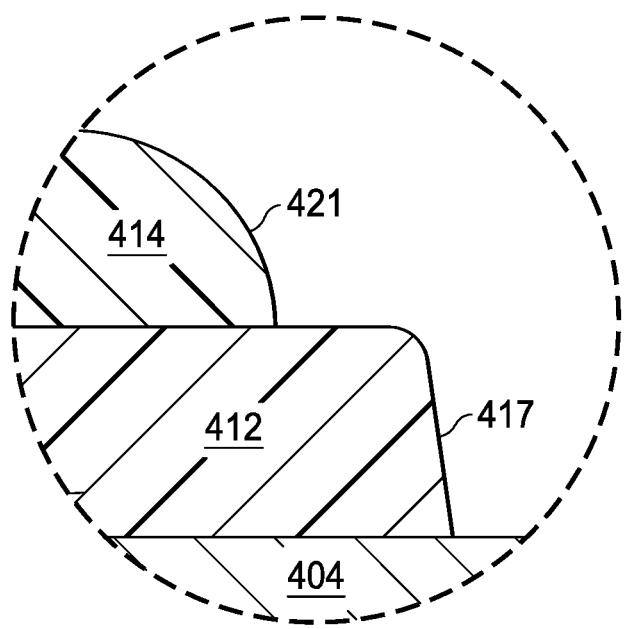
Figure 4B:
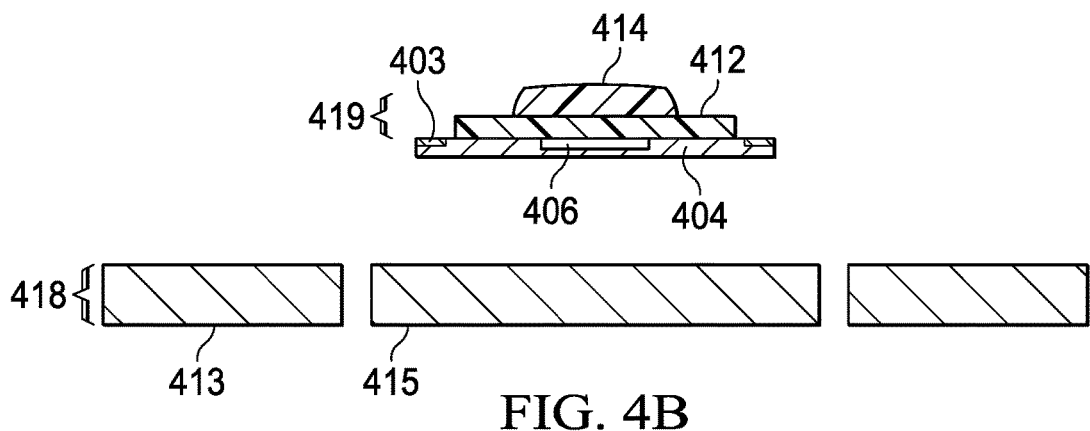
FIG. 4B is a cross sections of a singulated die spaced above a die mount pad of a lead frame, the singulated die having a stress buffer spaced above a component in the die, the stress buffer having first and second polymer layers of unequal width, the second polymer layer having convex sidewalls and being of less width than the first polymer layer.
Figure 4C:
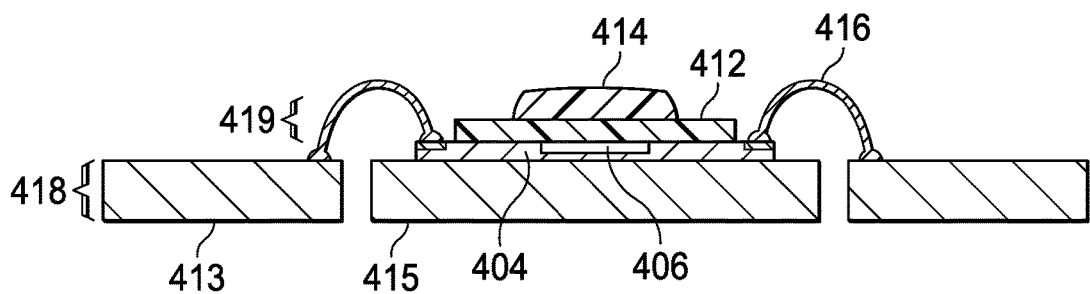
FIG. 4C is a cross section of the singulated die of FIG. 4B attached to the die mount pad and wire bonded to leads of the lead frame.
Figure 4D:
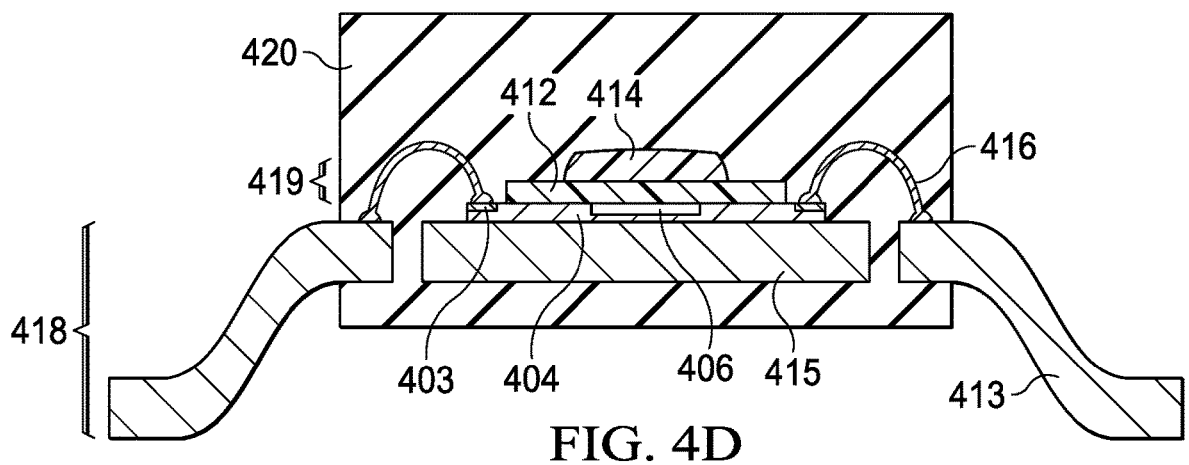
FIG. 4D is a cross section of the singulated die attached to the die mount pad of FIG. 2C further encapsulated with mold compound.
Figure 6A:
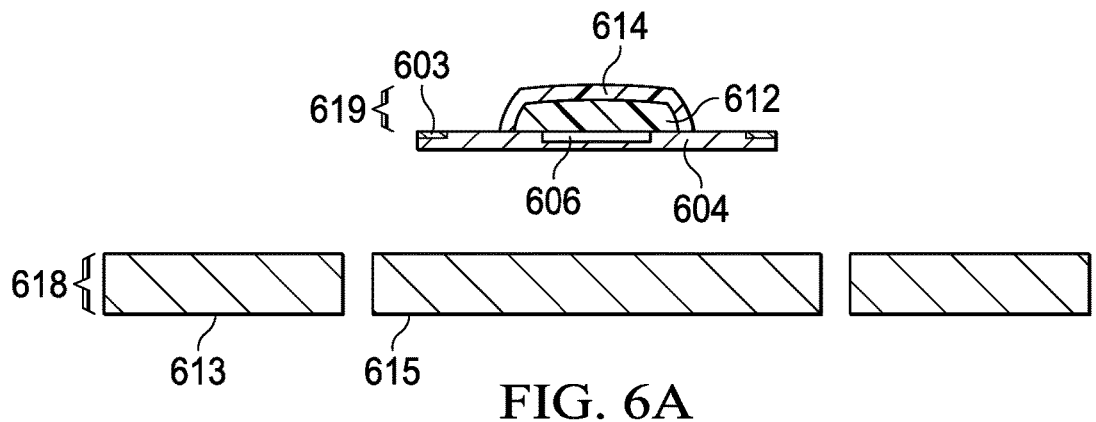
FIG. 6A is a cross section of a singulated die spaced above a die mount pad of a lead frame, the singulated die having a stress buffer spaced above a component in the die, the stress buffer having first and second polymer layers of unequal width, the second polymer layer covering top and side surfaces of the first polymer layer.
Figure 6B:
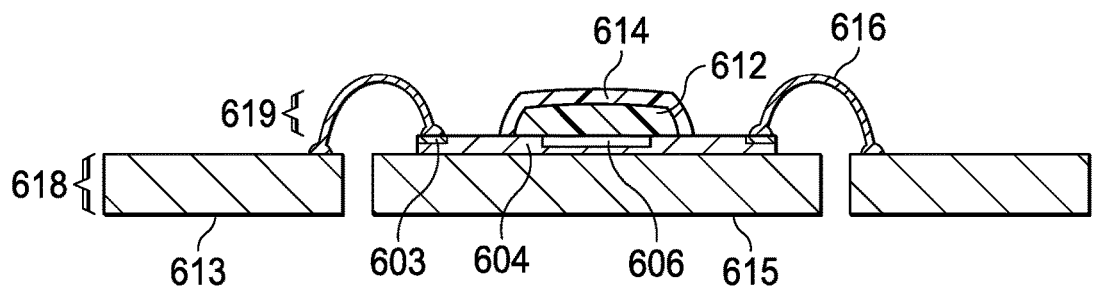
FIG. 6B is a cross section of the singulated die of FIG. 6A attached to the die mount pad and wire bonded to leads of the lead frame.
Figure 6C:
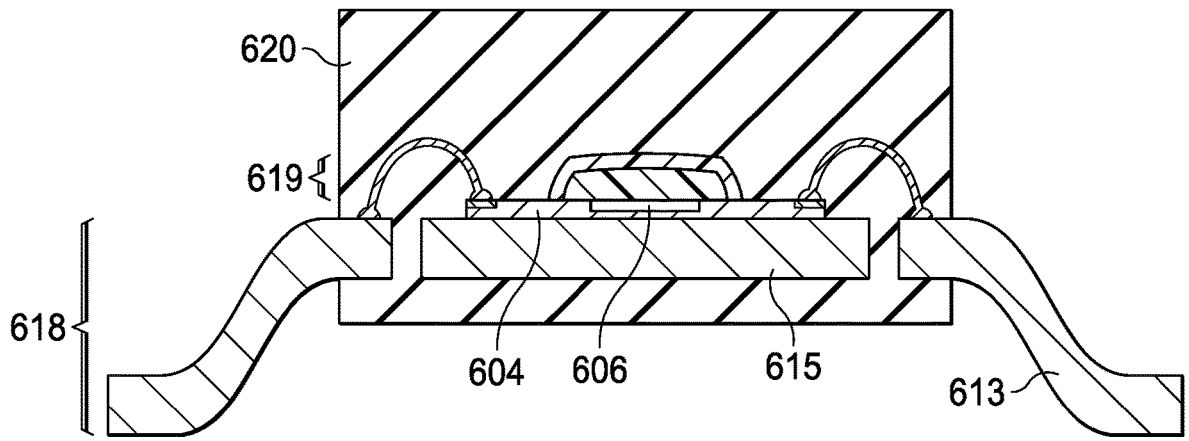
FIG. 6C is a cross section of the singulated die attached to the die mount pad of FIG. 6B further encapsulated with mold compound.

FIGS. 2C, 4D, and 6C, are cross sections of packaged semiconductor devices (PSD) with bilayer stress buffers between a component and mold compound. While the examples are illustrated herein with a bilayer stress buffer, multilayer stress buffers with more than two polymer layers can also be used at additional cost.

Figure 1B:
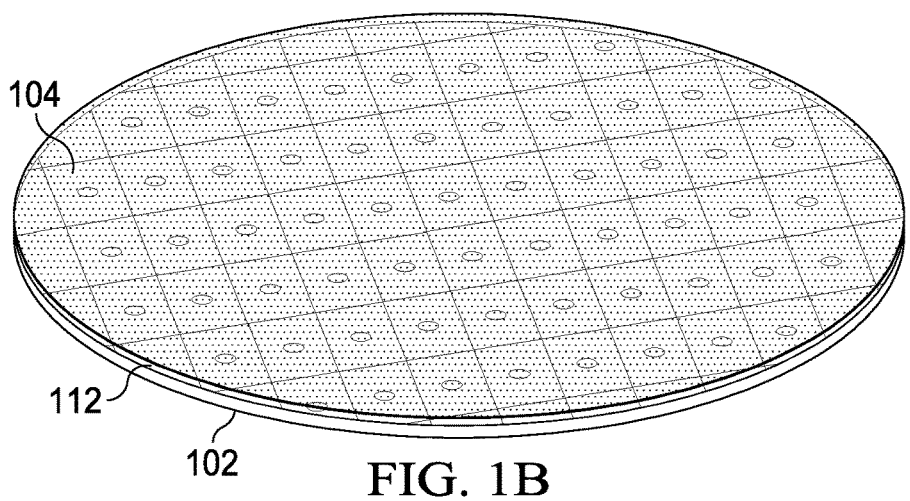
FIG. 1B is a projection view of a semiconductor wafer with device dies coated with a first polymer layer.
Figure 1C:
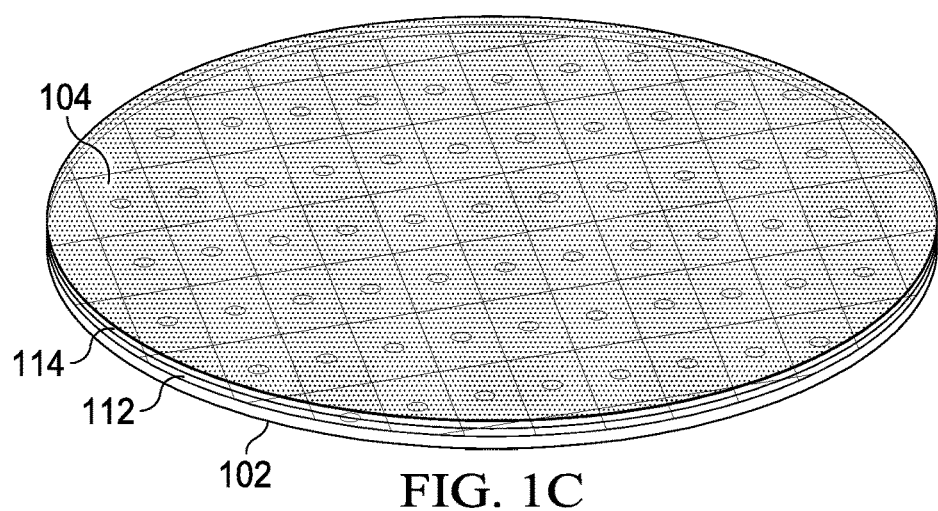
FIG. 1C is a projection view of a semiconductor wafer with device dies with a first layer plus a second polymer layer.

In FIG. 2C, similar reference labels are used for similar elements shown in FIG. 1C, for clarity. For example, die 204 in FIG. 2C corresponds to die 104 in FIG. 1C. In FIG. 2C, die 204 is mounted on a substrate. In this example the substrate is a conductive lead frame 218. In this example, lead frame 218 includes leads 213 and a die mount pad 215. Lead frames are initially connected together by saw streets (832 in FIG. 8A) and provided in a lead frame strip (see FIG. 8A) prior to assembly. Individual lead frames 815 are then separated by sawing through the saw streets 832 during assembly. In semiconductor device packages useful with the arrangements, both leaded (with the lead frame leads extending away from the package mold compound (see leads 913 FIG. 9E) and no-lead (see portions 813 in FIG. 8F hereinbelow) packages where the leads are formed to be positioned within the area of the package body and do not extend away from the mold compound are formed. The mold compound can be an epoxy, an epoxy blend (novolac, biphenyl, multi-aromatic), cyanate ester, silicone, silicone hybrid, or a polyimide and may be an epoxy thermoset resin. The leads can be on one, two or more sides of the finished package to form single, dual or quad type packages. For example, in FIG. 9E a dual leaded package is shown, while in FIG. 8F a quad no-lead package is shown.

Returning to FIG. 2C, wire bonds 216 electrically connect bond pads 203 on die 204 to leads 213 on the lead frame 218. The die 204 contains or carries a component 206 that can be sensitive to stress. The component can be located within die 204 proximate a surface of the semiconductor die 204, on the surface of the semiconductor die, at a surface of the semiconductor die, or, formed at an initial surface of the semiconductor die and then covered by layers of conductors and insulating dielectric layers, so that these layers lie over the initial surface of the semiconductor material of the die, in all of these examples the component is described herein as located "proximate" a surface of the semiconductor die which includes components located on a surface, at a surface or located near a surface of the semiconductor die. In one example a first die 204 carries a second die 205 including a component 207 that is mounted to the top side (as oriented in the figures) of die 204. Bond wires connecting bond pads on second die 205 to leads 213 or bond pads 203 on first die 204 are not shown for clarity sake. In one example of this type of arrangement, the component 206 is a bulk acoustic wave device on a separate die 206. The die 204 can be a discrete semiconductor device such as a bipolar transistor, a few discrete devices such as a pair of power FET switches on a die, or can be an integrated circuit with multiple semiconductor devices such as the multiple capacitors in an A/D converter. The semiconductor die 204 can include passive devices such as resistors, inductors, filters, or active devices such as transistors. The semiconductor die can be an integrated circuit with hundreds or thousands of transistors coupled to form a functional circuit, for example a microprocessor or memory device. The component 206 can be, as examples, a capacitor or an array of capacitors, such as in an analog to digital converter (ADC). Other components that are sensitive to stress from mold compound can be component 206. Certain MOS transistors can be component 206. The semiconductor die 204, including in some examples component 206, may be fabricated using semiconductor fabrication techniques in a "front end of the line" or FEOL process. A passivation layer (not shown for simplicity) overlies the surface of the die 204 and component 206. Bond pad areas 203 are exposed from the passivation layer. The remaining processes for completing a packaged device may be performed in "back end of the line" or BEOL processes, often performed separately from the FEOL processes.

Except for the bond pad 203 areas, at least a portion of the surface of the die 204 including the component 206 and a passivation layer (not shown) is covered with a stress buffer 219. The stress buffer 219 consists a first polymer layer 212 with a thickness between about 5 µm and 20 µm and with a modulus less than 1 GPa (between about 0.1-1 GPa). The first polymer layer is overlying the die. A second polymer layer 214 with a thickness in the range of 2 µm to 10 µm and a modulus greater than 1 GPa (between about 1 GPa and 4 GPa) is overlying the first polymer layer 212. The first polymer layer (112 in FIG. 1C, 212 in FIG. 2C) can be a polymer such as a low viscosity silicone or a low glass transition temperature (Tg) bismaleimide. The first polymer layer (112 or 212) is preferably unfilled. The second polymer layer (114 in FIG. 1C or 214 in FIG. 2C) can be a polymer such as a polyimide, a polybenzoxazole (PBO), and an epoxy-based polymer such as negative photoresist SU8. The second polymer layer (114 or 214) can optionally be a metal/polymer composite such as a polyimide or epoxy filled with metal nanoparticles such as silver, gold, or copper or ceramic nanoparticles coated with a metal. Metal/polymer composites can have a modulus in the range of 6-9 GPa. The second polymer layer (114 or 214) can be unfilled or can be filled with small filler particles (less than about 100 nm) if desired. Filler particles can be used to reduce cost or enhance mechanical and thermal properties of the polymer. The total thickness of the stress buffer 219 can be between about 10 µm and 30 µm.

Returning to FIG. 2C, the polymer layers, 212 and 214, may be deposited using a process such as spin-coating, slit coating or by ink-jet deposition. The die mount pad 215, the die 204, the bond pads 203, the wire bonds 216, and a portion of the leads 213 are coated with mold compound 220. In the example arrangement of FIG. 2C portions of the leads 213 extending away from the mold compound 220 are not covered in mold compound 220; instead, these portions of leads 213 form external leads or terminals for the finished PSD. The terminals allow both electrical connection and mechanical attachment to the PSD. For example, the lead frame leads 213 may be surface mounted to a system circuit board (not shown).

When polymers are deposited using spin-coating or slit coating, the entire surface of the dies including the bond pads (203 FIG. 2A, 403 FIG. 4A) are first covered. The polymer is then removed from the bond pads using patterning, exposure and etch if the polymer is photoactive or using patterning and etch if not photoactive. These processes produce a layer with straight, within about 20 degrees of vertical as oriented in the figures, sidewalls 417 as illustrated in the expanded view in FIG. 4AA. (Vertical is the orientation perpendicular to the surface on which the polymer is deposited.)

When polymers are deposited using ink-jet deposition, the layer can be built up by depositing multiple layers each formed of drops of ink. This method produces a layer with convex sidewalls 421 as is illustrated in the expanded view in FIG. 4AA.

In FIG. 4C, die 404 is mounted on a substrate. In FIG. 4C, similar reference labels are used for similar elements shown in FIG. 2C, for clarity. For example, die 404 in FIG. 4C corresponds to die 204 in FIG. 2C. In this example the substrate is a conductive lead frame 418 with a die mount pad 415 and with leads 413. Wire bonds 416 electrically connect bond pads 403 the die 404 to leads 413 on the lead frame 418. The die 404 contains a component 406. The component 406 can have properties that can change when the component is exposed to stress due to mold compound 420 (see FIG. 4D). The component 406 is covered with a stress buffer layer 419. The stress buffer layer 419 consists a first layer of polymer 412 with a thickness between about 5 µm and 20 µm and with a modulus less than 1 GPa. Except for bond pad areas 403, this first layer of polymer 412 covers the surface of the die 404. This first polymer layer 412 can be deposited using spin-coating, slit coating or ink-jet deposition. A second layer of polymer 414 with a thickness in the range of 2 µm to 10 µm and a modulus greater than 1 GPa covers at least a portion of the top layer of polymer 412 in the area immediately above component 406 and also covering the surface of the die 404 extending a distance at least about 20 µm beyond the edge of the component 406. The second layer of polymer 414 can be deposited from a nozzle using a process such as ink-jet depositions. The total thickness of the stress buffer 419 can be between about 10 µm and 30 µm. As shown in FIG. 4D, the die mount pad 415, the die 404, the bond pads 403, the wire bonds 416, and a portion of the leads 413 are covered with mold compound 420. In the example arrangement of FIG. 4D the portions of the leads 413 extending away from the mold compound 420 are not covered in mold compound and form external leads or terminals for the finished PSD. The terminals allow both electrical connection and mechanical attachment to the PSD. For example, the lead frame leads 413 may be surface mounted to a system circuit board (not shown).

In FIG. 6C, die 604 is mounted on a substrate. In FIG. 6C, similar reference labels are used for similar elements shown in FIG. 2C, for clarity. For example, die 604 in FIG. 6C corresponds to die 204 in FIG. 2C. In this example the substrate is a conductive lead frame 618 with a die mount pad 615 and with leads 613. Wire bonds 616 electrically connect bond pads 603 the die 604 to leads 613 on the lead frame 618. The die 604 contains a component 606. The component 606 can have electrical properties that change when stress is applied, for example by mold compound surrounding portions of the semiconductor die. The component 606 is covered with a stress buffer 619. The stress buffer 619 consists a first layer of polymer 612 with a thickness between about 5 µm and 20 µm and with a modulus less than 1 GPa. This first polymer layer 612 covers the component 606 and also covers the surface of the die 604 to a distance of at least about 20 µm surrounding the component 606. The first polymer layer 612 should also be kept at least 20 µm away from peripheral bond pad 603. This first polymer layer 612 can be deposited using spin-coating, slit coating or ink-jet deposition. A second layer of polymer 614 with a thickness in the range of 2 µm to 10 µm and a modulus greater than 1 GPa covers the first layer of polymer 612. The second layer of polymer 614 can be deposited from a nozzle using a process such as ink-jet deposition. The total thickness of the stress buffer 619 can be between about 5 µm and 30 µm. The die mount pad 615, the die 604, the bond pads 603, the wire bonds 616, and a portion of the leads 613 are covered with mold compound 620. In the example arrangement of FIG. 6C the portions of the leads 613 extending away from the mold compound 620 are not covered with mold compound 620. These portions of leads 613 form external leads or terminals for the finished PSD. The terminals allow both electrical connection and mechanical attachment to the PSD. For example, the lead frame leads 613 may be surface mounted to a system circuit board (not shown).

The stress buffer (219 FIG. 2C, 419 FIG. 4D, 619 FIG. 6C) between the component (206 FIG. 2C, 406 FIG. 4D, 606 FIG. 6C) and the mold compound (220 FIG. 2C, 420 FIG. 4D, 620 FIG. 6C) in the packaged semiconductor device, significantly reduces or eliminates degradation in the performance of the component (206 FIG. 2C, 406 FIG. 4D, 606 FIG. 6C) that can occur as a result of stress on the component 606 due to mold compound (220 FIG. 2C, 420 FIG. 4D, 620 FIG. 6C).

Figure 3:
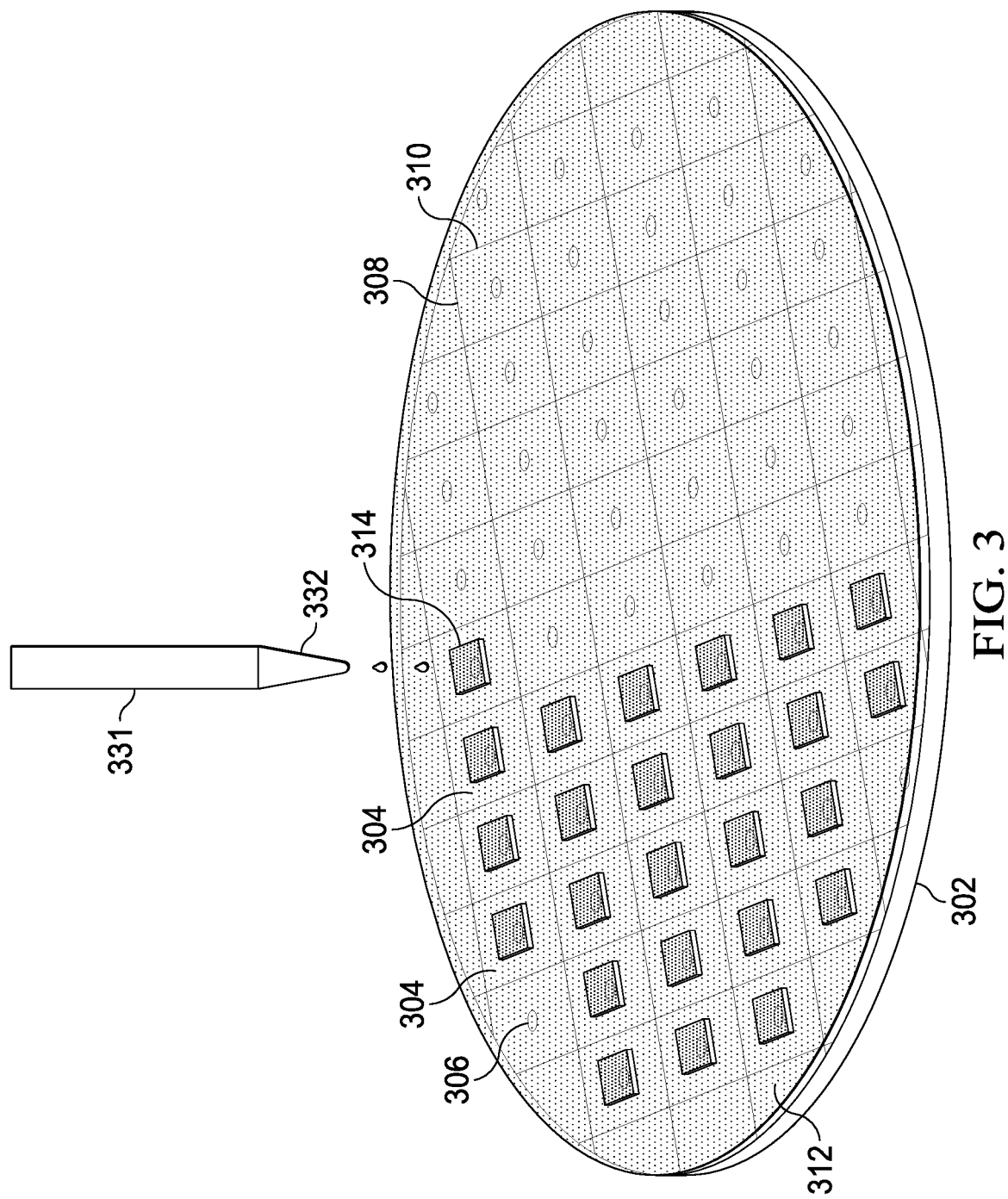
FIG. 3 is a projection view of device dies that are coated with a first polymer layer being coated with a second polymer layer using ink-jet deposition.
Figure 7:
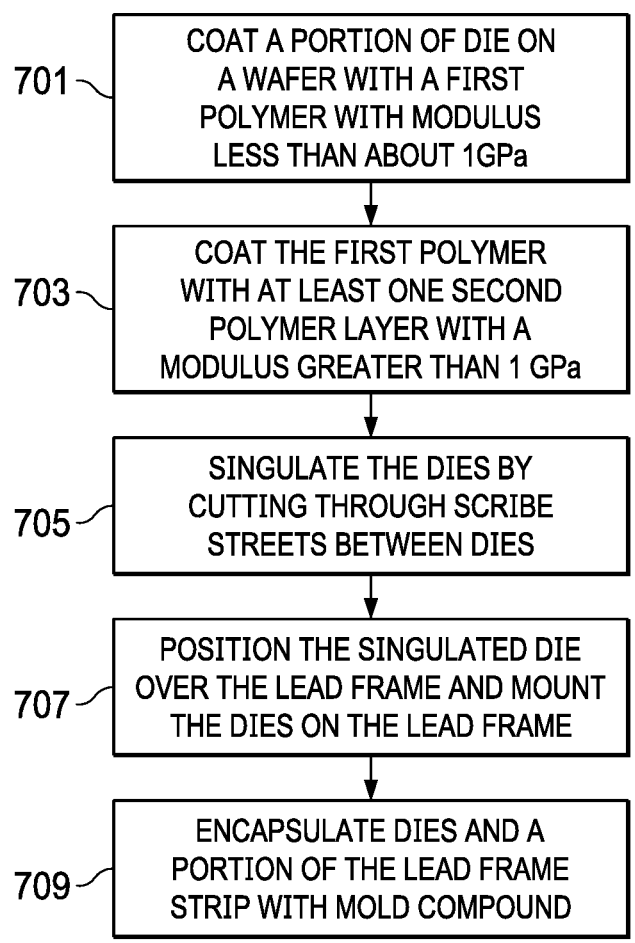
FIG. 7 is a flow diagram for covering components with first and second layers of polymer in wafer form prior to singulation of the semiconductor dies and packaging the semiconductor devices.

Methods for forming the packaged semiconductor devices such as shown in FIGS. 2C, 4D, and 6C are described in the flow diagram in FIG. 7 and in FIGS. 1A through 1C plus FIGS. 2A through 2C; FIG. 3 plus FIGS. 4A through 4C; and FIG. 5 plus FIGS. 6A through 6C respectively.

FIG. 1A is an illustration of a semiconductor wafer 102. The surface of the semiconductor wafer 102 is covered with semiconductor dies 104 separated by vertical 110 and horizontal 108 scribe streets. The semiconductor dies 104 contain a component 106 whose performance can change with applied stress such as an A/D converter or a BAW device. The semiconductor dies can also contain other semiconductor devices such as integrated circuits, subcircuits, and memory arrays.

The method for forming the packaged semiconductor devices shown in FIGS. 2C, 4D, and 6C begins in step 701 with coating the component (106 FIG. 1A, 306 FIG. 3, 506 FIG. 5) and a portion of the surface of the semiconductor wafer surrounding the component with a first polymer layer (112 FIG. 1, 312 FIG. 3, 512 FIG. 5). The semiconductor wafer can be coated with the first polymer layer using a process such as spin-coating, slit coating, or by ink-jet deposition. Ink-jet deposition is much more cost effective with respect to polymer usage and is more environmentally friendly. In addition, with ink-jet deposition the polymer can be left uncoated in selected areas, whereas with spin-coating or slit coating the polymer is deposited over the bondpads (for example) and then later removed using additional processing steps at additional cost. With spin-coating less than 10% of the polymer dispensed ends up as the first polymer layer on the wafer, whereas with ink-jet deposition greater than 90% of the polymer dispensed ends up as the first polymer layer. The first polymer layer (112 FIG. 1, 212 FIG. 2, 312 FIG. 3, 512 FIG. 5) can be a polymer such as a low viscosity silicone, or a low glass transition temperature (Tg) bismaleimide. The thickness of the first polymer layer covering the component is between 5 µm to 20 µm. A modulus of the first polymer layer is less than 1 GPa and can be between 0.1-1 GPa. The first polymer layer can be flash cured to increase the viscosity sufficiently to hold it in place. If the first polymer layer is a thermally curable polymer, it can be heated to about 150 Celsius for 5 min. to 10 min. If the first polymer layer is a UV curable polymer, UV pinning (exposing the polymer to a short flash of UV light) can be used to stabilize the polymer layer without fully curing it.

Illustrated in FIG. 1B and FIG. 3 the first polymer layer (112 FIG. 1B, 312 FIG. 3) covers the entire surface of the dies (104 FIG. 1B, 304 FIG. 3) except for bond pads (203 FIG. 2C, 403 FIG. 4C). The first polymer layer (112 in FIG. 1B, 312 FIG. 3) can be deposited using spin-coating, slit coating or ink-jet deposition.

Figure 5:
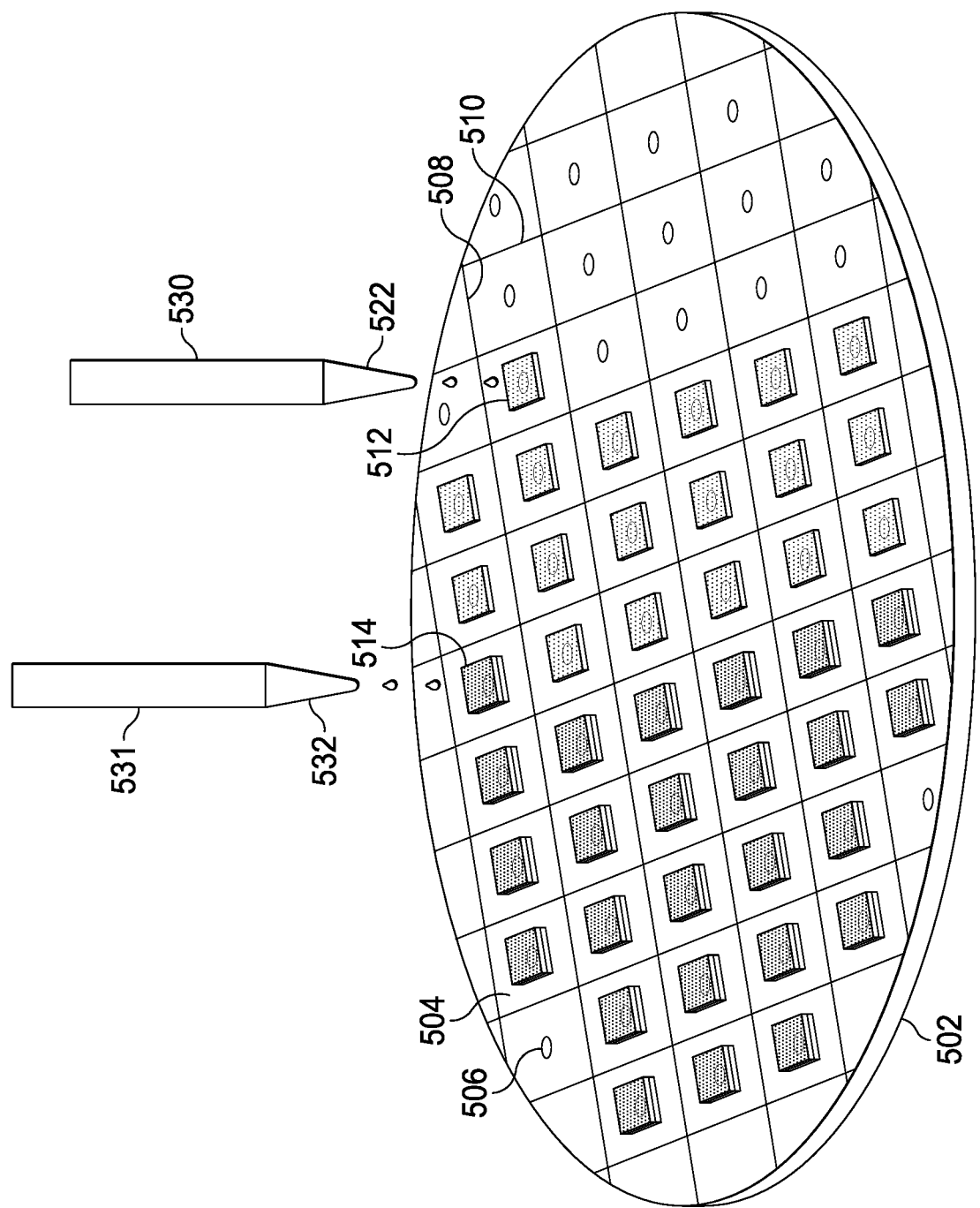
FIG. 5 is a projection view of a semiconductor die on a wafer with a component being coated with a first polymer layer using a first ink-jet deposition tool and with the first polymer being coated with a second polymer layer using a second ink-jet deposition tool.

In FIG. 5, similar reference labels are used for similar elements shown in FIG. 2C, for clarity. For example, die 504 in FIG. 5 corresponds to die 204 in FIG. 2C. Illustrated in FIG. 5, the first polymer layer 512 is dispensed from the nozzle 522 of an ink-jet deposition tool 530 to cover the component 506 and the surface of the dies to at least a distance of 20 µm surrounding the component 506. The first polymer layer 512 should also be kept at least 20 µm away from the peripheral bond pads 503.

The method then proceeds to step 703 with coating the first polymer layer (112 FIG. 1B, 312 FIG. 3, 512 FIG. 5) with a second polymer layer (114 FIG. 1C, 314 FIG. 3, 514 FIG. 5). The second polymer coating process can by spin-coating, slit coating or ink-jet deposition. The second polymer layer 114 can be a polymer such as such as a polyimide, a polybenzoxazole (PBO), and an epoxy-based polymer such as SU8 with a modulus greater than 1 GPa. A preferred modulus range for the second polymer layer is 2-4 GPa. The second polymer layer can be unfilled or can be filled with small filler particles (less than about 100 nm) if desired to reduce cost and/or enhance mechanical and thermal properties. The total thickness of the stress buffer (first polymer layer plus the second polymer layer) can be between about 5 µm and 30 µm. Following coating with the second polymer layer, the stress buffer (219 FIG. 2A, 419 FIG. 4A, 619 FIG. 6A) can be cured. Thermal curable polymers can be thermally cured in an oven in a nitrogen atmosphere at a temperature of 150° C.-200° C. for a time of up to one hour. UV curable polymers can be UV cured using UV light (635 nm-695 nm) for 15-30 min.

Illustrated in FIG. 1C the second polymer layer 114 covers the entire surface of the dies 104 except for bond pads (203 FIG. 2C). The second polymer layer 114 in FIG. 1C can be deposited using a process such as spin-coating, slit coating or ink-jet deposition.

Illustrated in FIG. 3 and FIG. 5, the second polymer layer (314 FIG. 3, 514 FIG. 5) is dispensed from the nozzle (332 FIG. 3, 532 FIG. 5) of an ink-jet deposition tool (331 FIG. 3, 531 FIG. 5) to cover the component (306 FIG. 3, 506 FIG. 5) and a surface of the dies (304 FIG. 3, 504 FIG. 5) to a distance of at least 20 µm (304 FIG. 3, 504 FIG. 5) surrounding the component.

In step 705 the dies (104 FIG. 1A, 304 FIG. 3, 504 FIG. 5) are singulated by cutting through the wafers (102 FIG. 1A, 302 FIG. 3, 502, FIG. 5) along the horizontal (108 FIG. 1A, 308 FIG. 3, 508, FIG. 5) and vertical (110 FIG. 1A, 310 FIG. 3, 510, FIG. 5) scribes. Wafer dicing can be done in a number of ways, such as: mechanical dicing, laser groove plus mechanical dicing, stealth dicing, sawing, and plasma dicing.

In step 707 the singulated dies (204 FIG. 2A, 404 FIG. 4A, 604 FIG. 6A) are positioned above the lead frames (218 FIG. 2A, 418 FIG. 4A, 618 FIG. 6A) and are bonded to the die mount pad (215 FIG. 2B, 415 FIG. 4B, 615 FIG. 6B).

In step 709 the singulated dies (204 FIG. 2C, 404 FIG. 4C, 604 FIG. 6C) the stress buffer (219 FIG. 2C, 419 FIG. 4C, 619 FIG. 6C), the bond wires (216 FIG. 2C, 416 FIG. 4C, 616 FIG. 6C) and a portion of the leads (213 FIG. 2C, 413 FIG. 4C, 613 FIG. 6C) are covered with mold compound (220 FIG. 2C, 420 FIG. 4D, 620 FIG. 6C) to form the packaged semiconductor devices shown in FIGS. 2C, 4D, and 6C.

Figure 8B:
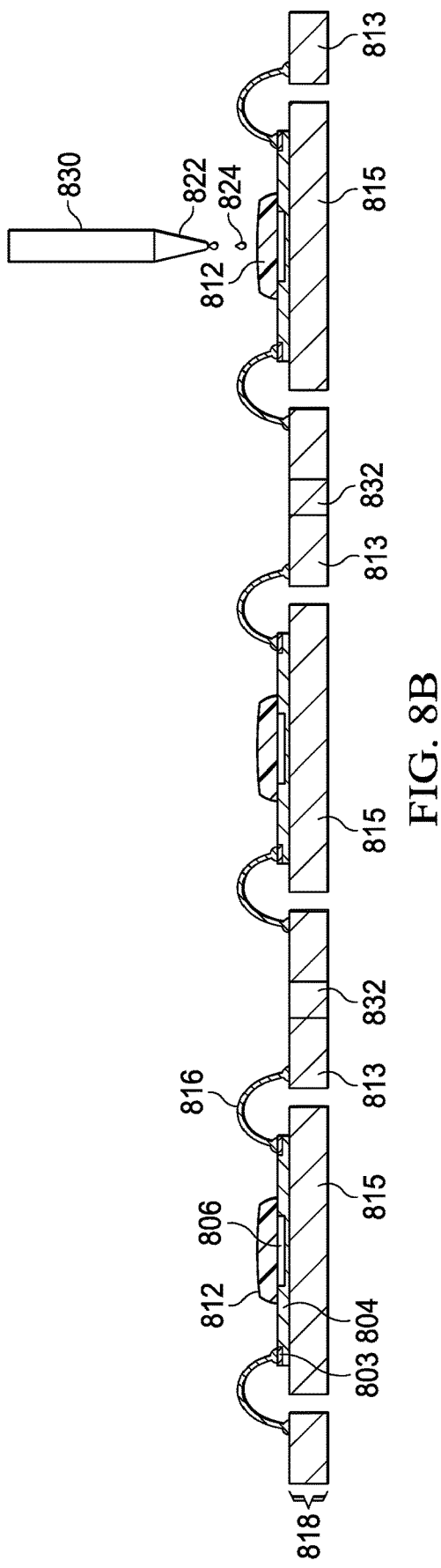
FIG. 8B is the cross section of FIG. 8A in which each die is attached to respective die attach mount of a respective lead frame and wire bonded to the leads of the lead frame, a first polymer layer covering a component in the die.
Figure 8B:
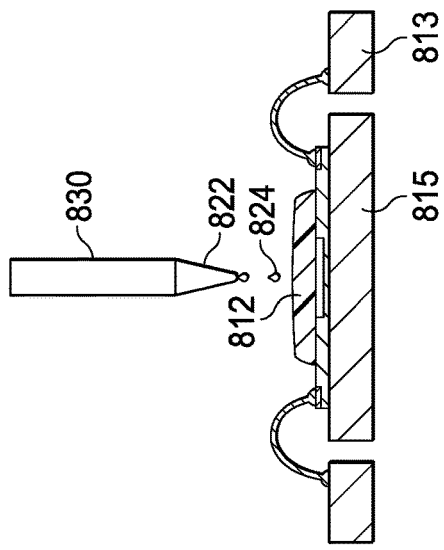
Figure 8F:
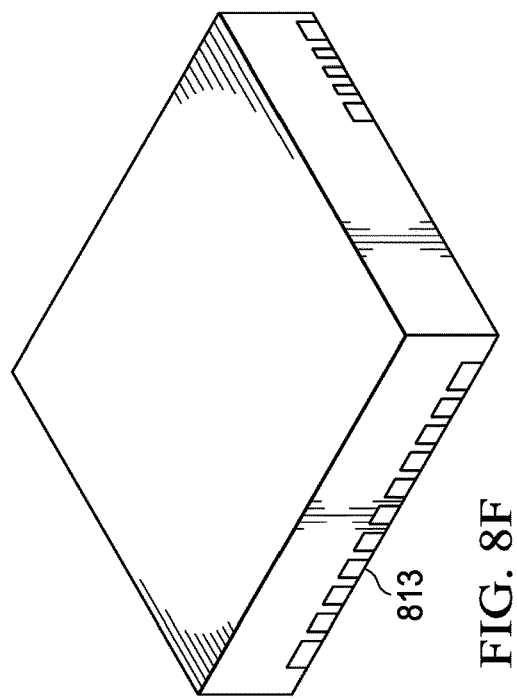
FIG. 8F is a plan view of a commercially manufactured quad no-lead packaged semiconductor device.
Figure 9A:
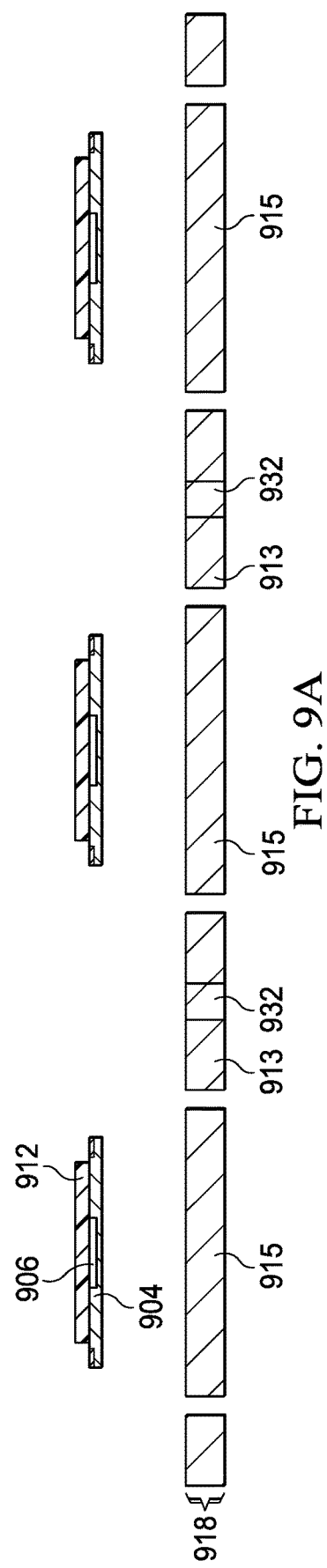
FIG. 9A is a cross section of multiple lead frames initially connected together by saw streets a lead frame strip and a die spaced above each lead frame prior to assembly.
Figure 9D:
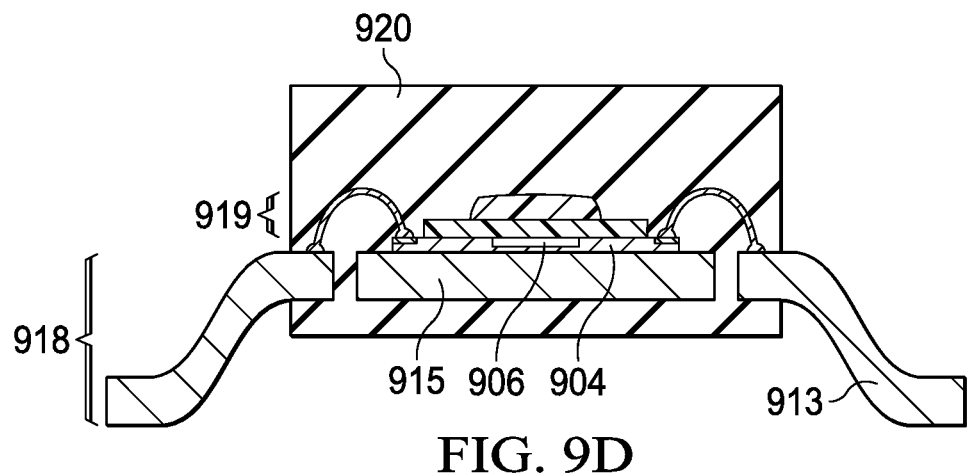
FIG. 9D is a cross section of one of the encapsulated devices of FIG. 9C after singulation in which the exposed external leads are bent to form inline package leads.
Figure 9E:
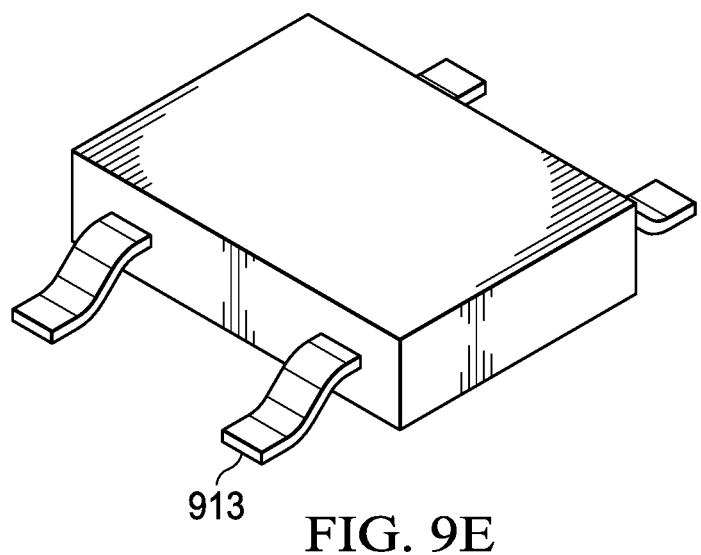
FIG. 9E is a plan view of a commercially manufactured dual inline packaged semiconductor device.
Figure 10:
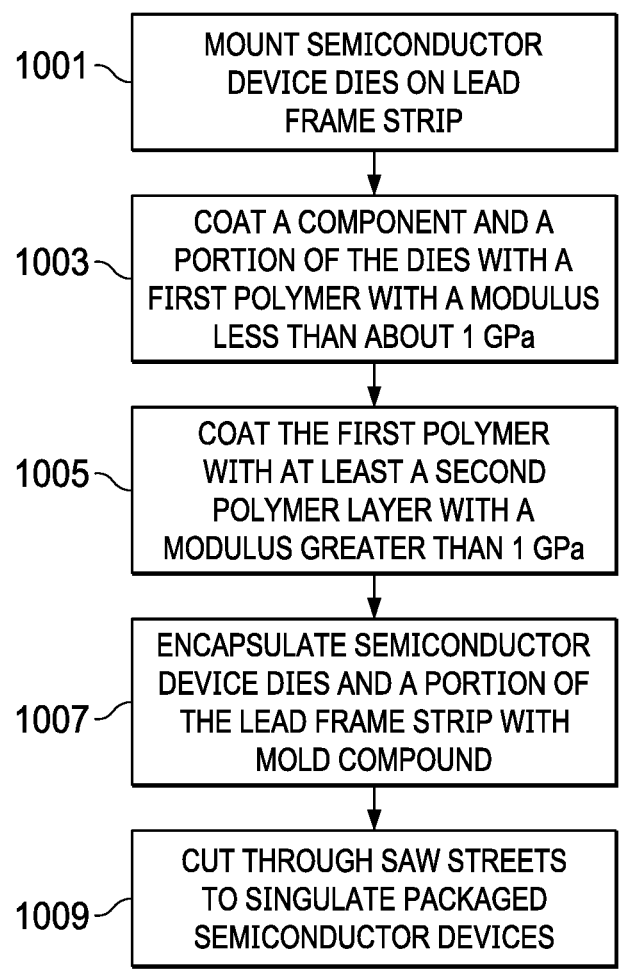
FIG. 10 is a flow diagram illustrating the process described in cross sections in FIGS. 9A-9D.

An alternative method for forming packaged semiconductor devices is illustrated in the flow diagram in FIG. 10 and the cross sections in FIG. 8A through 8E and FIG. 9A through 9D. In the heretofore mentioned method the polymer layers that form the stress buffer between the component and the mold compound are deposited onto the semiconductor wafer prior to singulation and packaging. In the alternative method mentioned below singulated dies are mounted on a substrate prior to deposition of the stress buffer layers. FIGS. 8A-8E illustrate the formation of a packaged semiconductor device in a quad, no-lead package such as is shown in the projection view in FIG. 8F. FIGS. 9A-9D illustrate the formation of a packaged semiconductor device in a dual inline lead package such as is shown in the projection view in FIG. 9E.

In step 1001 in FIG. 10 singulated semiconductor device dies (804 FIG. 8A, 904 FIG. 9A) are mounted on a lead frame strip. The lead frame strip is comprised of individual lead frames (818 FIG. 8A, 918 FIG. 9B) with the leads (813 FIG. 8A, 913 FIG. 9B) connected together by saw streets (832 FIG. 8A, 932 FIG. 9B). In FIGS. 8A and 9A, similar reference labels are used for similar elements shown in FIG. 2C, for clarity. For example, die 804 in FIG. 8A and 904 in FIG. 9A correspond to die 204 in FIG. 2C. The saw street material is the same as the individual lead frame material. The singulated semiconductor device dies (804 FIG. 8A, 904 FIG. 9A) are electrically coupled to the leads (813 FIG. 8B, 913 FIG. 9B) with bond wires (816 FIG. 8B, 916 FIG. 9B). The semiconductor device dies (804 FIG. 8A, 904 FIG. 9A), contain a component (806 FIG. 8A, 906 FIG. 9A) such as an A/D converter or a BAW whose performance can change when covered with mold compound (820 FIG. 8E, 920 FIG. 9D).

In step 1003, illustrated in FIGS. 8B and 9A, the component (806 FIG. 8B, 906 FIG. 9A) and the surface of the die to a distance of at least 20 μm surrounding the component (806 FIG. 8B, 906 FIG. 9A) are covered with a first polymer layer (812 FIG. 8B, 912 FIG. 9B). The first polymer layer should be kept at least 20 μm from the peripheral bond pads 803. The thickness of the first polymer layer is between 5 μm to 20 μm. A modulus of the first polymer layer is less than 1 GPa and can be in the range of about 0.1-1 GPa. The first polymer layer can be flash cured to increase its viscosity sufficiently to hold it in place. When using a thermally curable polymer, the layer can be heated to about 150° C. for 5 min. to 10 min. When a UV curable polymer is used, UV pinning can be used to stabilize the film without fully curing it.

In FIG. 8B, an ink-jet deposition tool 830 dispenses first polymer 824 from nozzle 822 to cover the component 806 and to cover the surface of the die 804 to a distance of at least 20 μm surrounding the component 806. The first polymer 824 should be kept at least 20 μm away from the peripheral bond pads 803.

In FIG. 8BB, an ink-jet deposition tool 830 dispenses first polymer 824 from nozzle 822 to cover the mold compound sensitive component 806 and to cover the entire surface of the die 804 except for bondpad 803 regions.

In FIG. 9A semiconductor device dies 904 with a first polymer layer 924 already covering the mold compound sensitive component 906 are positioned above the lead frame strip. The lead frame strip is comprised of individual lead frames 918 with the leads 913 coupled together with saw streets 932 that are the same material as the lead frames 918.

In FIG. 9B the semiconductor dies 904 are bonded to die mount pads 915 on the lead frames 918 and are electrically connected to leads 913 with bond wires 916.

In step 1005 a second polymer layer (814 FIG. 8C, 914 FIG. 9B) is coated onto the surface of the first polymer layer (812 FIG. 8C, 912 FIG. 9B). The second polymer layer 914 covers at least a portion of a top surface of the first polymer layer 912. The second polymer layer 914 can further cover the entire surface of the first polymer layer 912.

The second polymer layer 914 can be a polymer with a modulus greater than 1 GPa such as such as a polyimide, a polybenzoxazole (PBO), and an epoxy-based polymer such as SU8. A preferred modulus range for the second polymer layer is 2-4 GPa. The second polymer layer 914 can be unfilled or can be filled with small filler particles (less than about 100 nm) to reduce cost and/or to enhance mechanical and thermal properties. The total thickness of the stress buffer 919 (first polymer layer 912 plus second polymer layer 914) can be between about 5 μm and 30 μm. Following coating with the second polymer layer 914, the stress buffer layer 919 can be cured. Thermal curable polymers can be thermally cured in an oven in a nitrogen atmosphere at a temperature of 150° C.-200° C. for a time of up to one hour. UV curable polymers can be UV cured using UV light (635 nm-695 nm) for 15-30 min.

In FIG. 8C and FIG. 8CC an ink-jet deposition tool 831 dispenses the second polymer material 814 from nozzle 822 to cover the surface of the first polymer material 812. The first polymer layer 812 plus the second polymer layer 814 forms the stress buffer 819.

In FIG. 9B an ink-jet deposition tool 931 dispenses second polymer material 914 from nozzle 922 to cover the surface of the first polymer layer 912 covering the component 912. The second polymer layer 914 can cover a portion of the first polymer layer 912 or can cover the surface of the first polymer layer 912 completely. The first polymer layer 912 plus the second polymer layer 914 forms a stress buffer layer 919.

In step 1007 the semiconductor device dies (804 FIGS. 8D and 8DD, 904 FIG. 9C), the stress buffer layers (819 FIG. 8D, 919 FIG. 9C), and portions of the lead frame (818 FIG. 8D, 918 FIG. 9C) are covered with mold compound (820 FIG. 8D, 920 FIG. 9C).

In the example arrangements of FIG. 9C the portions of the leads 913 extending away from the mold compound 920 are not covered in mold compound. These portions of leads 913 form external leads or terminals for the finished PSD. The terminals allow both electrical connection and mechanical attachment to the PSD. As illustrated in FIG. 9D, after singulation the exposed external leads 913 may be bent to form the inline package leads as in FIG. 9E.

Modifications are possible in the described arrangements, and other alternative arrangements are possible within the scope of the claims.

What is claimed is:

1. A method for forming a packaged semiconductor device, comprising:
   dispensing a first polymer layer having a first modulus less than 1 GPa and the first polymer layer covering a component proximate a surface of a semiconductor die and covering at least a portion of the surface of the semiconductor die surrounding the component;
   dispensing a second polymer layer having a second modulus greater than 1 GPa and the second polymer layer covering at least a portion of the first polymer layer;
   mounting the semiconductor die on a substrate; and
   covering at least the surface of the semiconductor die and a portion of the substrate with mold compound.

2. The method of claim 1, wherein the portion of the surface is a distance of at least 20 µm surrounding the component.

3. The method of claim 1, wherein the first modulus is between 0.1 to 1 GPa and the second modulus is between 2 to 4 GPa.

4. The method of claim 1, further comprising first dispensing the first polymer layer to a thickness between 5 µm and 20 µm and second dispensing the second polymer layer to a thickness between 2 µm and 10 µm.

5. The method of claim 1, wherein the first dispensing and the second dispensing are performed using an ink-jet deposition tool.

6. The method of claim 1, wherein the first dispensing and the second dispensing are performed using spin-coating.

7. The method of claim 1, wherein the first dispensing and the second dispensing are performed using slit coating.

8. The method of claim 1, wherein the first dispensing is spin-coating and the second dispensing is ink-jet deposition.

9. The method of claim 1, wherein the first dispensing is slit coating and the second dispensing is ink-jet deposition.

10. The method of claim 1, wherein the component is located within the semiconductor die proximate a surface of the semiconductor die.

11. The method of claim 1, wherein the component is located on the surface of the semiconductor die.

12. The method of claim 1, wherein the component is located at a surface of the semiconductor die.

13. The method of claim 1, wherein the component is formed at an initial surface of the semiconductor die and then covered by layers of conductors and insulating dielectric layers.

14. A method for forming a packaged semiconductor device, comprising:
   mounting a semiconductor die on a substrate;
   dispensing a first polymer layer having a first modulus less than 1 GPa and the first polymer layer covering a component that is proximate to a surface of the semiconductor die and covering the component and the surface of the semiconductor die surrounding the component to a distance of at least 20 µm;
   dispensing a second polymer layer having a second modulus greater than 1 GPa and the second polymer layer covering at least a portion of the first polymer layer;
   covering the semiconductor die and a portion of the substrate with mold compound.

15. The method of claim 14, wherein the first modulus is between 0.1 to 1 GPa and the second modulus is between 2 and 4 GPa.

16. The method of claim 14, including dispensing the first polymer layer with a thickness between 5 µm and 20 µm, and ink-jet depositing the second polymer layer with thickness between 2 µm and 10 µm.

17. The method of claim 14, wherein ink-jet deposition is used to dispense the first polymer layer.

18. The method of claim 14 wherein the first polymer layer is spin-coated onto the semiconductor die.

19. The method of claim 14 wherein the first polymer layer is slit coated onto the semiconductor die.

20. The method of claim 14, wherein the component is located within the semiconductor die proximate a surface of the semiconductor die.

21. The method of claim 14, wherein the component is located on the surface of the semiconductor die.

22. The method of claim 14, wherein the component is located at a surface of the semiconductor die.

23. The method of claim 14, wherein the component is formed at an initial surface of the semiconductor die and then covered by layers of conductors and insulating dielectric layers.

24. A method for forming a packaged semiconductor device, comprising:
   dispensing a first polymer layer having a first modulus less than 1 GPa and the first polymer layer covering a component that is proximate to a surface of a semiconductor die and covering the component and the surface of the semiconductor die surrounding the component to a distance of at least 20 µm;
   mounting the semiconductor die on a substrate;
   ink-jet depositing a second polymer layer having a second modulus greater than 1 GPa and the second polymer layer covering at least a portion of the first polymer layer; and
   covering the semiconductor die and a portion of the substrate with mold compound.

25. A method for forming a packaged semiconductor device, comprising:
   mounting a first semiconductor die on a substrate;
   mounting a second semiconductor die on the first semiconductor die;
   dispensing a first polymer layer having a first modulus less than 1 GPa and the first polymer layer covering a component proximate a surface of the second semiconductor die and covering at least a portion of the surface of the second semiconductor die surrounding the component;
   second dispensing a second polymer layer having a second modulus greater than 1 GPa and the second polymer layer covering at least a portion of the first polymer layer; and
   covering at least the surface of the first semiconductor die, the second semiconductor die and a portion of the substrate with mold compound.

* * * * *